United States Patent
Worm et al.

(10) Patent No.: US 9,994,243 B1
(45) Date of Patent: Jun. 12, 2018

(54) CLEAR ENCLOSURE TOP DOME FOR END OF TRAIN DEVICE

(71) Applicant: Siemens Industry, Inc., Alpharetta, GA (US)

(72) Inventors: Steven Worm, Raleigh, NC (US); Frank G. Armsworthy, Holly Springs, NC (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days. days.

(21) Appl. No.: 15/641,912

(22) Filed: Jul. 5, 2017

(51) Int. Cl.
*B61L 15/00* (2006.01)
*B61L 15/02* (2006.01)
*H05K 5/00* (2006.01)
*H05K 5/02* (2006.01)

(52) U.S. Cl.
CPC ......... *B61L 15/0054* (2013.01); *B61L 15/009* (2013.01); *B61L 15/02* (2013.01); *H05K 5/0017* (2013.01); *H05K 5/023* (2013.01); *H05K 5/0217* (2013.01)

(58) Field of Classification Search
None
See application file for complete search history.

(56) References Cited

U.S. PATENT DOCUMENTS

| | | | | |
|---|---|---|---|---|
| 2,748,371 A * | 5/1956 | Wilcox | ............ | B64D 47/06 246/473.3 |
| 4,435,053 A * | 3/1984 | Woloshuk | ............ | G03B 35/00 352/123 |
| 5,376,925 A * | 12/1994 | Crisafulli | ............ | B61L 15/0027 246/167 R |
| 5,497,096 A * | 3/1996 | Banting | ............ | G01R 15/18 324/543 |
| 5,532,677 A * | 7/1996 | Miller | ............ | A63B 57/00 340/286.01 |
| 6,008,731 A * | 12/1999 | Capan | ............ | B61L 1/14 246/167 R |
| 6,102,491 A * | 8/2000 | Bezos | ............ | B60T 13/665 246/167 R |
| 6,227,625 B1 * | 5/2001 | Gaughan | ............ | B60T 13/665 303/15 |
| 9,393,977 B2 * | 7/2016 | Kramer | ............ | B61L 15/009 |
| 9,783,213 B2 * | 10/2017 | Gloyd | ............ | B61G 7/14 |
| 2005/0180007 A1 * | 8/2005 | Cossairt | ............ | G02B 27/2285 359/465 |
| 2006/0226298 A1 * | 10/2006 | Pierson | ............ | A63H 19/24 246/1 R |
| 2009/0109013 A1 * | 4/2009 | Kane | ............ | B61L 15/0054 340/466 |
| 2010/0213321 A1 * | 8/2010 | Kane | ............ | B61L 15/0027 246/167 R |
| 2011/0013375 A1 * | 1/2011 | Menow | ............ | A63H 33/22 362/34 |

(Continued)

*Primary Examiner* — Xanthia C Cunningham

(57) ABSTRACT

An end of train device suitable of use on a railroad vehicle includes an enclosure, and a plurality of electronic components including one or more displays positioned inside the enclosure, the one or more displays displaying information provided by the end of train device, wherein the enclosure comprises a top portion and a bottom portion, and wherein the top portion comprises a transparent dome, the information displayed by the one or more displays being visible from an outside of the enclosure through the transparent dome of the top portion.

15 Claims, 4 Drawing Sheets

(56) References Cited

U.S. PATENT DOCUMENTS

| | | | |
|---|---|---|---|
| 2011/0172856 A1* | 7/2011 | Kull | B61L 15/0027 701/19 |
| 2011/0251742 A1* | 10/2011 | Haas | B61L 15/0054 701/19 |
| 2012/0192756 A1* | 8/2012 | Miller | B61K 9/08 104/2 |
| 2013/0002687 A1* | 1/2013 | Conti | F21V 23/0435 345/501 |
| 2013/0211670 A1* | 8/2013 | Morimoto | B61D 37/00 701/36 |
| 2015/0259001 A1* | 9/2015 | Gloyd | B61L 15/0054 213/7 |
| 2015/0327401 A1* | 11/2015 | Maes | G09F 9/30 362/97.1 |
| 2016/0096537 A1* | 4/2016 | Bartek | B61L 15/0027 246/124 |
| 2016/0114820 A1* | 4/2016 | Palmer | B61L 25/02 246/107 |
| 2017/0066459 A1* | 3/2017 | Singh | B61L 23/044 |
| 2017/0088153 A1* | 3/2017 | Fernandes | B61L 25/028 |
| 2017/0201725 A1* | 7/2017 | Siminoff | H04N 7/186 |
| 2017/0301136 A1* | 10/2017 | Arsan | G06T 19/003 |
| 2018/0043912 A1* | 2/2018 | Dulmage | B61L 3/02 |

* cited by examiner

CLEAR ENCLOSURE TOP DOME FOR END OF TRAIN DEVICE

BACKGROUND

1. Field

Aspects of the present invention generally relate to an end of train device, in particular to a clear enclosure top dome for an end of train device, for a railroad vehicle, such as for example a freight train.

2. Description of the Related Art

Within the railroad industry, an end of train device, herein also referred to as EOTD, is typically attached at a rear of a last car on a railroad vehicle or train, often to an unused coupling on an end of the last car opposite the head of the train. EOTDs were originally designed to perform some of the functions previously performed by train personnel located in the caboose, thereby allowing trains to operate without a caboose and with a reduced number of train personnel.

An EOTD is an electronic device which can perform a number of functions, some of which are required by regulations of the Federal Railroad Administration (FRA). For example, an EOTD can monitor air pressure in the air brake pipe and transmit this information to a head of train device (HOTD). Further, EOTDs also often include an end-of-train marker light to alert trailing trains on the same track of the presence of the end of the train. Two-way EOTDs can accept commands from the HOTD, for example to open a valve to release pressure in the air brake pipe so that the train's air brakes activate to stop the train in an emergency situation. Some EOTDs include GPS receivers that are used to transmit location information pertaining to the end of the train to the HOTD or other control units. EOTDs can comprise many other components and/or functions.

Electronics and/or components of EOTDs are enclosed within a sealed enclosure or housing for environmental protection. EOTDs may have multiple electronic displays that must be visible from each side of the EOTD. Further, the end-of-train marker light, also known as high visibility marker light (HVM), must be visible from a back of the EOTD. Thus, EOTD enclosures require that one or more clear windows be incorporated into the housing to a) allow operator(s) to see the electronic displays located within the EOTD, and b) to allow light from the high visibility marker light (HVM) to illuminate the rearward of the train.

The typical design solution consists of a separate window for each light output point (displays and HVM), each requiring a clear lens, gaskets and mounting hardware. The relatively high number of parts required results in an increase in the material and labor costs for the product compared to the cost that would otherwise exist if windows were not necessary. Also, the multiple gaskets represent potential ingress points for environmental moisture into the product enclosure. Therefore, there is a need for an improved EOTD, in particular an improved enclosure for an EOTD.

SUMMARY

Briefly described, aspects of the present invention relate to an end of train device (EOTD), in particular to a clear enclosure top dome for an EOTD. The EOTD is suitable for railway vehicles such as freight trains and passenger trains. The EOTD is located in a last car of a railway vehicle or train.

A first aspect of the present invention provides an end of train device suitable of use on a railroad vehicle comprising an enclosure, and a plurality of electronic components including at least one display positioned inside the enclosure, the at least one display displaying information provided by the end of train device, wherein the enclosure comprises a top portion and a bottom portion, and wherein the top portion comprises a transparent dome, the information displayed by the at least one display being visible from an outside of the enclosure through the transparent dome of the top portion.

A second aspect of the present invention provides a railway vehicle comprising an end of train device mounted on a car of the railway vehicle, the end of train device the end of train device comprising an enclosure, and a plurality of electronic components including at least one display positioned inside the enclosure, the at least one display displaying information provided by the end of train device, wherein the enclosure comprises a top portion and a bottom portion, and wherein the top portion comprises a transparent dome, the information displayed by the at least one display being visible from an outside of the enclosure through the transparent dome of the top portion.

DETAILED DESCRIPTION

To facilitate an understanding of embodiments, principles, and features of the present invention, they are explained hereinafter with reference to implementation in illustrative embodiments. In particular, they are described in the context of an end of train device (EOTD) for a railroad vehicle. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
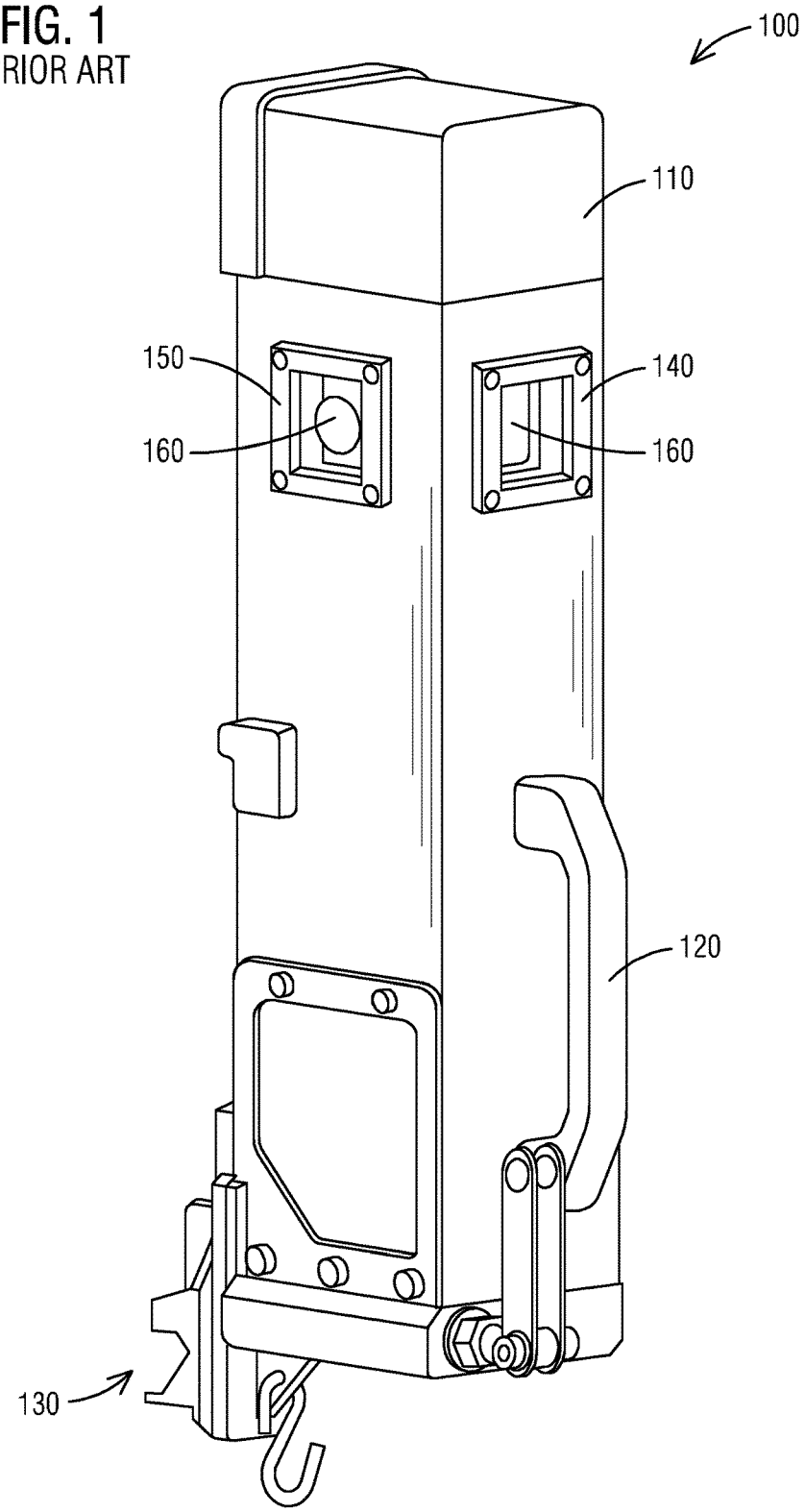
FIG. 1 illustrates a perspective view of a known end of train device (EOTD) in accordance with an embodiment disclosed herein.

FIG. 1 illustrates a perspective view of a known end of train device (EOTD) 100 in accordance with an embodiment disclosed herein. The EOTD 100 includes a housing 110 in which internal components of the EOTD 100 are located. The housing 110 is a sealed housing for environmental protection. A handle 120 is attached to the housing 110 to facilitate installation and removal of the EOTD 100 on/off a train car of a railroad vehicle, in particular a last train car. The EOTD 100 further comprises a coupling unit 130, typically attached to the housing 110, which couples the EOTD 100 to the train car, for example a train car coupling. The housing 110 is typically made from an opaque material.

The EOTD 100 comprises many different components and electronics positioned inside the housing 110, which will not be described herein in detail as one of ordinary skill in the art is familiar with structure, components and functions of EOTDs. Some of the components and electronics are for example one or more displays 140 and a high visibility marker light (HVM) 150 to illuminate a rearward of the railway vehicle (train). As noted above, the housing 110 is typically made from an opaque material. But the one or more displays 140 must be visible from an outside of the housing 110 and allow providing information and data of the components and electronics to operator(s). The HVM 150 must also visible from an outside of the housing 110 to illuminate the rearward of the train. Therefore, each display 140 and HVM 150, i.e. each light output point, comprises a separate window 160 so that each display 140 and HVM 150 is visible from an outside of the housing 110, wherein each window 160 requires a clear lens, gaskets and mounting hardware in order to provide the sealed housing 110. Further, the display(s) 140 and HVM 150 generally must be located somewhere near a top of the EOTD 100 to provide visibility. In case that the EOTD 100 comprises various radio, GPS and cell antennas, they must also be located near the top of the EOTD 100. These components located near the top of the EOTD 100, i.e. display(s) 140, HVM 150 and various antennas frequently need to be accessed by maintenance personnel for trouble shooting which may be difficult due to the structure of the housing 110.

Figure 2:
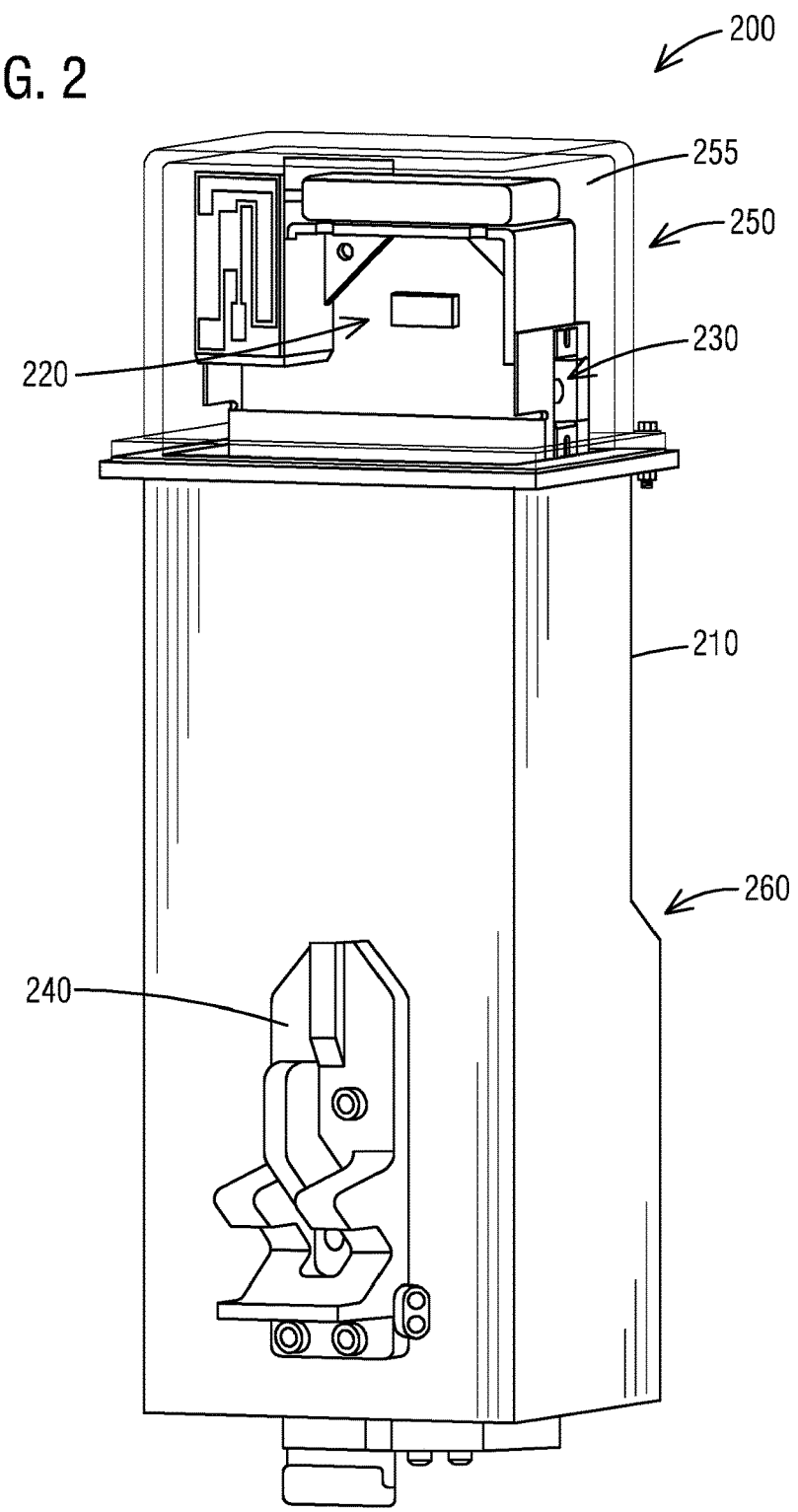
FIG. 2 illustrates a side view of an EOTD in accordance with an exemplary embodiment of the present invention.

FIG. 2 illustrates a side view of an EOTD 200 in accordance with an exemplary embodiment of the present invention. The EOTD 200 is suitable of use on a railroad vehicle located on a last car of the railroad vehicle, in particular a freight train. The EOTD 200 comprises an enclosure 210, and a plurality of components, such as electronic components, positioned inside the enclosure 210. For example, one or more displays 220 are positioned inside the enclosure 210. The one or more displays 220 display information and/or data provided by the EOTD 200. An important component of the EOTD 200 is a high visibility marker light (HVM) 230 which is utilized to illuminate a rearward of the railroad vehicle. FIG. 2 further illustrates a coupling unit 240, typically attached to the housing 210, which couples the EOTD 200 to the train car, for example a train car coupling. Examples of other components of the EOTD 200 are a global positioning system (GPS), cell phone transceivers, systems for monitoring/controlling brake lines and pressure, communication systems for communicating with other units such as for example head of train devices etc. As noted before, since one of ordinary skill in the art is familiar with structure, components and functions of different types of EOTDs, they will not be described in detail herein.

The enclosure 210 comprises a top portion 250 and a bottom portion 260. The top portion 250 comprises a transparent dome 255. The transparent dome 255 is configured such that information displayed by the displays 220 as well as the HVM 230 are visible from an outside of the enclosure 210 through the transparent dome 255 of the top portion 250. The bottom portion 260 can be opaque or also transparent. The top portion 250 and bottom portion 260 together form the enclosure 210.

In an embodiment, the top portion 250 comprising the transparent dome 255 is formed from transparent material, for example molded from transparent material. The transparent material comprises clear plastic material, such as for example polycarbonate. Polycarbonate is available in grades that are clear and that have UV resistance, and it is a strong material that is suitable for use in an industrial enclosure. The top portion 250 can be a monolithic component. In other words, the top portion 250 including the transparent dome 255 can be a one-piece component formed or molded from transparent material thereby providing a single part as the top portion 250. The bottom portion 260 can be formed, for example molded, from plastic material, but would typically not comprise transparent plastic material, but opaque plastic material.

The transparent dome 255 of the top portion 250 can comprise different shapes or forms. The transparent dome 255 comprises such a shape or form that the one or more displays 220 and HVM 230 are covered by the dome 255 in an adequate manner. For example, in view of an overall design of the EOTD 200, the transparent dome 255 comprises a shape of a cuboid with rectangular surfaces as illustrated in FIG. 2. Alternatively, the transparent dome 255 may comprise a rounded shape, for example a hemispherical shape.

Figure 3:
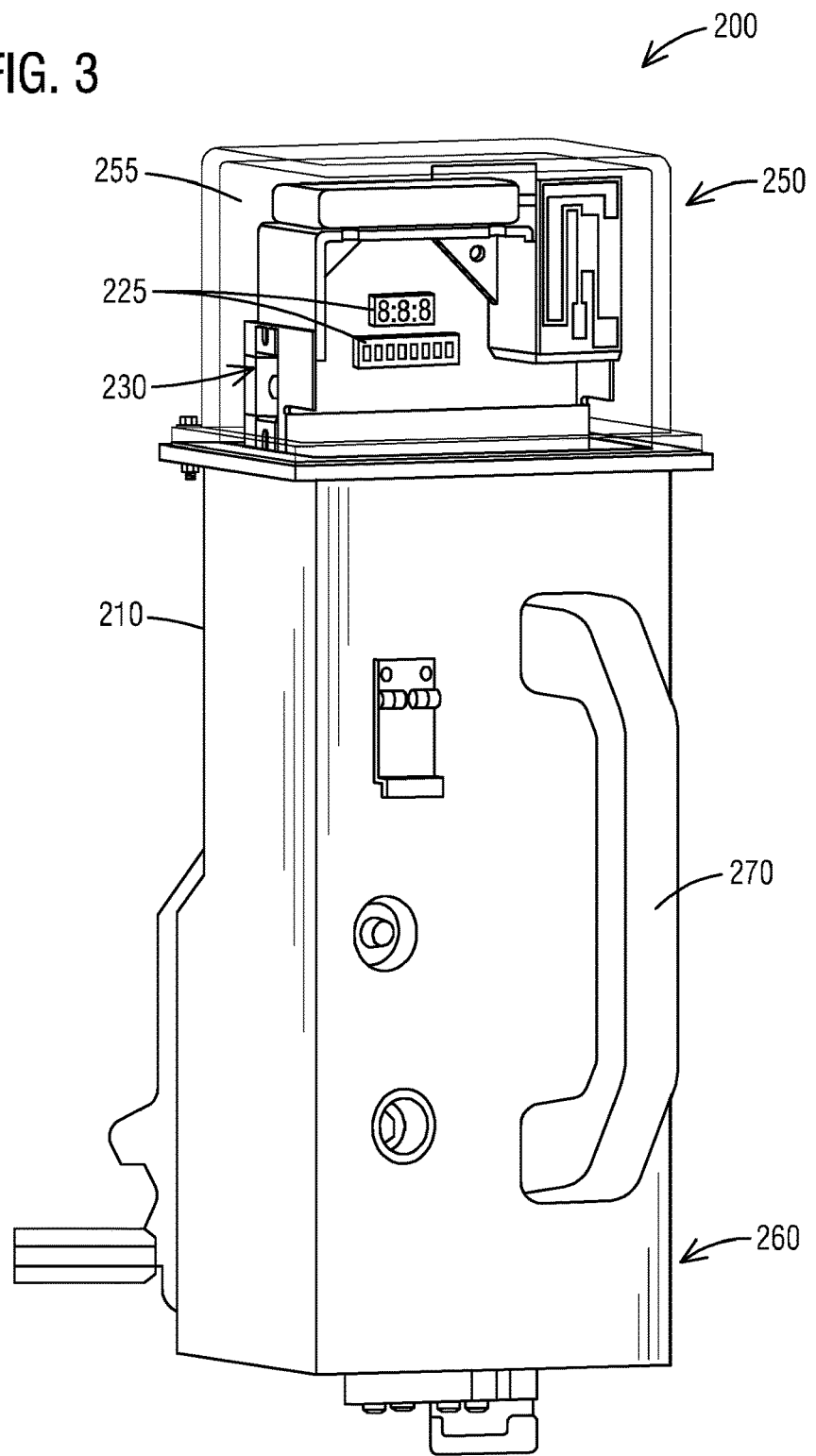
FIG. 3 illustrates another side view of an EOTD in accordance with an exemplary embodiment of the present invention.

FIG. 3 illustrates another side view of the EOTD 200 in accordance with an exemplary embodiment of the present invention. While FIG. 2 illustrates a left side view, FIG. 3 illustrates a right side view of the EOTD 200. The EOTD 200 comprises the top portion 250 and bottom portion 260 forming the enclosure 210, with the top portion 250 comprising the transparent dome 255. Located or arranged inside the enclosure 210 are multiple components, in particular electronic components, for example the HVM 230. Within the top portion 250 of the enclosure 210 are positioned further displays 225 in addition to the display 220 (see FIG. 2). The further displays 225 are arranged essentially opposite the display 220. Thus, the EOTD 200 comprises three displays 220, 225 located within the top portion 250, specifically the transparent dome 255, of the enclosure 210. Of course, the EOTD 200 can comprise more or less than three displays, depending on a type or configuration of the EOTD 200. As noted before, the displays 220, 225 provide and display information and/or data of the EOTD 200 to operator(s) of the railroad vehicle and/or other railroad personnel. The displays 220, 225 and HVM 230 are positioned inside the transparent dome 255 so that they are visible from outside the enclosure 210 through the transparent dome 255. The view of FIG. 3 further illustrates a handle 270 attached to the housing 210 for handling such as installation and removal of the EOTD 200 on/off a train car of a railroad vehicle, in particular a last train car.

Figure 4:
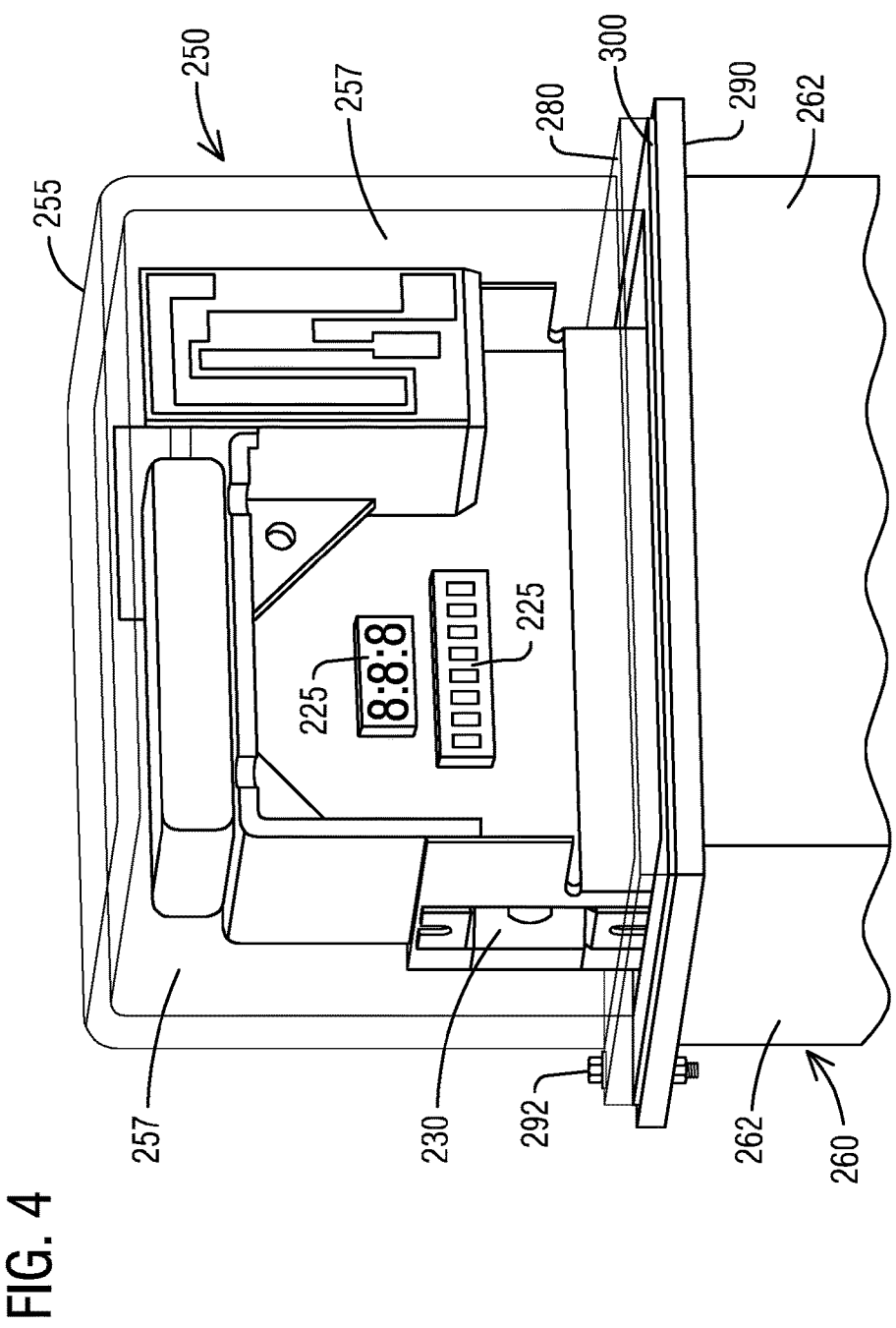
FIG. 4 illustrates an enlarged section of a top portion of an EOTD in accordance with an exemplary embodiment of the present invention.

FIG. 4 illustrates an enlarged section of the top portion 250 of the EOTD 200 as illustrated in FIG. 3 in accordance with an exemplary embodiment of the present invention.

In an embodiment, the top portion 250 is mounted to the bottom portion 260. For example, when assembling the EOTD 200, internal components and the bottom portion 260 are mounted before the top portion 250 is placed and mounted on top of the bottom portion 260. For mounting purposes, the top portion 250 and bottom portion 260 each comprise a mounting flange 280, 290. The top portion 250 comprises top mounting flange 280 and the bottom portion 260 comprises bottom mounting flange 290. The mounting flanges 280, 290 can be configured as circumferential edges or borders, wherein the circumferential edges or borders can be arranged perpendicular to side walls of the top and bottom portions 250, 260. For example, the top portion 250, specifically the transparent dome 255, can comprises a shape of a cuboid with multiple rectangular side walls 257 (in this case four side walls 257), wherein the top mounting flange 280 is configured as circumferential edge attached to ends of the side walls 257, wherein an angle between side walls 257 and flange 280 is about 90°. The bottom mounting flange 290 and the bottom portion 260 can be configured similarly, wherein the bottom portion 260 comprises multiple side walls 262 and the bottom mounting flange 290 is attached to ends of the side walls 262. Of course, the mounting flanges 280, 290 can be designed in many other ways. For example, the mounting flanges 280, 290 can extend only over sections of the top and bottom portions 250, 260, for example along or over two opposite side walls 257, 262 (instead of all four side walls). In other words, instead of one circumferential mounting flange 280 (290), two (or more) mounting flanges are provided at different side walls 257 (262).

The top portion 250 is mounted to the bottom portion 260 by mounting means which provide a detachable connection so that the top portion 250 can be easily detached from the bottom portion 260 in case the top portion 250 needs to be replaced or repaired. For example, the top portion 250 can be mounted to the bottom portion 260 by multiple nuts and screws utilizing the mounting flanges 280, 290. Thus, the mounting flanges 280, 290 comprise multiple corresponding holes or bores for receiving and holding the screws and nuts. FIG. 4 illustrates an example screw-nut pair 292, but the EOTD 200 comprises multiple screw-nut pairs 292 distributed over the mounting flanges 280, 290. Interposed between the mounting flanges 280, 290 can be a gasket 300, which can be configured as a foam gasket. It should be noted that other mountings means may be utilized for detachably mounting the top portion 250 to the bottom portion 260, such as for example one or more clamps.

In an embodiment, the top portion 250 and mounting flange 280 are molded as a one-piece component (monolithic) from the transparent plastic material utilized in order to provide the transparent dome 255. The bottom portion 260 and mounting flange 290 can also be molded as a one-piece component from plastic material. Alternatively, the mounting flanges 280, 290 can be separate components and can be for example glued to the top portion 250 or bottom portion 260 respectively. In case the mounting flange 280 is a separate component and attached to the top portion 250, the mounting flange 280 may not be formed from the clear plastic material but from another plastic material which may not be transparent.

The EOTD 200 as disclosed and described herein, in particular in connection with FIGS. 2-4, comprises an improved sealed enclosure 210. The improved sealed enclosure 210 includes a single top portion 250 with transparent dome 255 so that all displays 220, 225 and HVM 230 of the EOTD 200 are visible from an outside through the transparent dome 255. Instead of multiple separate windows, each requiring a clear lens, gaskets and mounting hardware, for each display 220, 225 and HVM 230, the EOTD 200 comprises a single clear dome 255 thereby reducing a number of parts and thus material and labor costs of the EOTD 200. Further, the single top portion 250 with the clear top dome 255 is easy to install and/or replace via a detachable connection to the bottom portion 250 of the EOTD 200. As FIGS. 2-4 illustrate, the displays 220, 225 and HVM 230 are located in the top portion 250 of the EOTD 200 within the transparent dome 255. These components located in the top portion 250 (and other components of the top portion such as for example various antennas if provided) frequently need to be accessed by maintenance personnel for trouble shooting. The transparent dome 255 allows easy access to these components since only the transparent dome 255 needs to be removed instead of requiring significant disassembly of various windows 160 of a known EOTD 100 (see FIG. 1).

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

What is claimed is:

1. An end of train device suitable of use on a railroad vehicle comprising:
   an enclosure, and
   a plurality of electronic components including at least one display positioned inside the enclosure, the at least one display displaying information provided by the end of train device,
   wherein the enclosure comprises a top portion and a bottom portion, and
   wherein the top portion comprises a transparent dome, the information displayed by the at least one display being visible from an outside of the enclosure through the transparent dome of the top portion.

2. The end of train device of claim 1, wherein the top portion is formed from transparent material.

3. The end of train device of claim 2, wherein the top portion is molded from the transparent material.

4. The end of train device of claim 1, wherein the top portion comprising the transparent dome is monolithic.

5. The end of train device of claim 2, wherein the transparent material comprises plastic material.

6. The end of train device of claim 5, wherein the plastic material comprises polycarbonate.

7. The end of train device of claim 1, further comprising a high visibility marker light, the high visibility marker light being visible from an outside of the enclosure through the transparent dome of the top portion.

8. The end of train device of claim 1, wherein the top portion is mounted to the bottom portion, and wherein the top portion and bottom portion each comprise a mounting flange.

9. The end of train device of claim 8, wherein the top portion is mounted to the bottom portion by multiple nuts and screws utilizing the mounting flanges.

10. The end of train device of claim 8, further comprising a gasket interposed between the mounting flanges of the top portion and bottom portion.

11. The end of train device of claim 10, wherein the gasket is configured as a foam gasket.

12. A railway vehicle comprising an end of train device mounted on a car of the railway vehicle, the end of train device comprising:
   an enclosure, and
   a plurality of electronic components including at least one display positioned inside the enclosure, the at least one display displaying information provided by the end of train device,
   wherein the enclosure comprises a top portion and a bottom portion, and
   wherein the top portion comprises a transparent dome, the information displayed by the at least one display being visible from an outside of the enclosure through the transparent dome of the top portion.

13. The railway vehicle of claim 12, wherein the end of train device is mounted on a last car of the railway vehicle.

14. The railway vehicle of claim 13, wherein the railway vehicle is a freight train.

15. The railway vehicle of claim 12, wherein the top portion of the end of train device is molded from transparent plastic material.

\* \* \* \* \*